United States Patent
Douglas et al.

(10) Patent No.: US 9,299,434 B2
(45) Date of Patent: Mar. 29, 2016

(54) DEDICATED EGRESS FAST PATH FOR NON-MATCHING PACKETS IN AN OPENFLOW SWITCH

(71) Applicant: Netronome Systems, Inc., Santa Clara, CA (US)

(72) Inventors: Gareth R. Douglas, Ballymena (GB); Ciaran J. Toal, Newtownabbey (GB); Sandra Scott-Hayward, Belfast (GB)

(73) Assignee: Netronome Systems, Inc., Santa Clara, CA (US)

( * ) Notice: Subject to any disclaimer, the term of this patent is extended or adjusted under 35 U.S.C. 154(b) by 255 days.

(21) Appl. No.: 14/151,730

(22) Filed: Jan. 9, 2014

(65) Prior Publication Data
US 2015/0194215 A1    Jul. 9, 2015

(51) Int. Cl.
| | | |
|---|---|---|
| *G11C 15/04* | (2006.01) | |
| *G06F 13/40* | (2006.01) | |
| *H04L 12/743* | (2013.01) | |
| *H04L 12/819* | (2013.01) | |
| *H04L 12/721* | (2013.01) | |

(52) U.S. Cl.
CPC ............ *G11C 15/04* (2013.01); *G06F 13/4022* (2013.01); *H04L 45/7453* (2013.01); *H04L 45/7457* (2013.01); *G06F 2213/0026* (2013.01); *H04L 45/38* (2013.01); *H04L 47/21* (2013.01)

(58) Field of Classification Search
None
See application file for complete search history.

(56) References Cited

U.S. PATENT DOCUMENTS

| | | | | |
|---|---|---|---|---|
| 7,633,871 | B1 * | 12/2009 | Callon ................... | H04L 47/10 370/230.1 |
| 8,626,955 | B2 * | 1/2014 | Veal ...................... | G06F 9/5088 709/238 |
| 8,854,972 | B1 * | 10/2014 | Li ......................... | H04L 47/12 370/235 |
| 2003/0187914 | A1 * | 10/2003 | Kaniyar ............... | H04L 67/1002 709/201 |
| 2009/0193216 | A1 * | 7/2009 | Melvin ................ | H04L 49/9094 711/166 |
| 2014/0153571 | A1 * | 6/2014 | Neugebauer ......... | H04L 45/7457 370/392 |
| 2014/0215561 | A1 * | 7/2014 | Roberson ............. | H04L 63/08 726/3 |
| 2015/0117458 | A1 * | 4/2015 | Gurkan ................ | H04L 45/72 370/392 |
| 2015/0124815 | A1 * | 5/2015 | Beliveau .............. | H04L 45/7453 370/392 |
| 2015/0131666 | A1 * | 5/2015 | Kang ................... | H04L 45/745 370/392 |
| 2015/0163146 | A1 * | 6/2015 | Zhang .................. | H04L 47/125 370/238 |
| 2015/0304212 | A1 * | 10/2015 | Zhou ................... | H04L 45/7457 370/392 |

* cited by examiner

*Primary Examiner* — Kaushikkumar Patel
(74) *Attorney, Agent, or Firm* — Imperium Patent Works LLP; T. Lester Wallace; Mark D. Marrello (57) ABSTRACT

A first packet of a flow received onto an OpenFlow switch causes a flow entry to be added to a flow table, but the associated action is to perform a TCAM lookup. A request is sent to an OpenFlow controller. A response OpenFlow message indicates an action. The response passes through a special dedicated egress fast-path such that the action is applied and the first packet is injected into the main data output path of the switch. A TCAM entry is also added that indicates the action. A second packet of the flow is then received and a flow table lookup causes a TCAM lookup, which indicates the action. The action is applied to the second packet, the packet is output from the switch, and the lookup table is updated so the flow entry will thereafter directly indicate the action. Subsequent packets of the flow do not involve TCAM lookups.

20 Claims, 6 Drawing Sheets

OPENFLOW SWITCH AND OPENFLOW CONTROLLER

ONE FLOW ENTRY

FIG. 3

RULE ACTION STRUCTURE

DEDICATED EGRESS FAST PATH FOR NON-MATCHING PACKETS IN AN OPENFLOW SWITCH

TECHNICAL FIELD

The described embodiments relate generally to the control and operation of OpenFlow switches and to related structures.

BACKGROUND INFORMATION

A type of networkswitch, sometimes referred to as an OpenFlow switch, receives packets of a flow onto one of several input ports. For each such packet, the switch examines parts of the headers of the packet, and from these headers determines the flow to which the packet belongs. For each such flow of packets, the switch has been preconfigured so that it will output packets of that flow onto a predetermined one of the output ports. Such a switch can be thought of as having a data plane through which packets pass between input ports and output ports, and a control plane through which switch operation can be controlled and monitored. A protocol, known as the OpenFlow protocol, has been developed to standardize the control plane interface to such OpenFlow switches. In one type of operation, an OpenFlow controller sends an OpenFlow switch an OpenFlow message. This OpenFlow switch recognizes the standard OpenFlowmessage and responds by adding a flow entry to a flow table in the OpenFlow switch. The flow entry may, for example, include an instruction to apply if the switch receives a packet of the flow. If an incoming packet is received onto the OpenFlow switch, header information as set forth above is used to check the flow table to determine whether a flow entry for the flow is stored in the flow table. The identified flow entry indicates actions that are to be applied. An example of an action is to send the packet out of the OpenFlow switch via a particular output port.

In addition to the OpenFlow message that instructs an OpenFlow switch to add a flow entry into a flow table, there are other types of OpenFlow messages through which the OpenFlow controller can cause an OpenFlow switch to add, update, or delete flow entries from flow tables. The above description of OpenFlow switches, an OpenFlow controller, and the OpenFlow protocol is very simplified. For more detailed information on the OpenFlow protocol, see for example OpenFlow Switch Specification, Version 1.3.1 (Wire Protocol 0x04), Sep. 6, 2012, available from the Open Networking Foundation.

SUMMARY

An NFP (Network Flow Processor) integrated circuit of an OpenFlow switch includes an RX processor, a load balancer processor, a plurality of worker processors, a host interface circuit, a dedicated host-to-TX processor, and a TX processor. The NFP integrated circuit, a host, an external memory, and an external TCAM integrated circuit together realize a flow table lookup functionality and a TCAM lookup functionality.

In one operational example, a first packet of a new flow is received onto the OpenFlow switch and onto the NFP integrated circuit via the RX processor. The RX processor stores the packet in the external memory. Some of the header information of this first packet is a flow key. On the NFP integrated circuit, a hash is generated from the flow key of this first packet. The load balancer processor uses the hash to send a descriptor for the first packet to one of the worker processors, where the descriptor indicates where the first packet is stored in external memory. The worker processor then causes a flow table lookup to be performed using the flow table lookup functionality, but no flow entry is found that matches the flow key. Because no matching flow entry is found, the worker processor causes a TCAM lookup operation to be performed using the TCAM lookup functionality, but no match is returned from the TCAM lookup functionality either. As a result of there being no match found by the flow table functionality or by the TCAM lookup functionality, the worker processor causes a flow entry to be entered into the flow table for the flow, but the action associated with the flow table entry is an instruction to do a TCAM lookup operation. The flow table entry does not indicate an actual action to apply. In addition, a request OpenFlow message is sent via the host interface circuit and the host from the OpenFlow switch to an OpenFlow controller. The OpenFlow message is a request for instructions on what to do with the first packet.

A response OpenFlow message is received back from the OpenFlow controller to the host. The host causes the first packet to be retrieved from external memory. The host applies the instructions (actions) to the first packet, and then sends the packet via the host interface circuit to the host-to-TX processor. The path from the host, through the host interface circuit, through the host-to-TX processor, to the TX processor is a fast-path path that the OpenFlow controller can use to inject packets into the main egress path of the NFP processor integrated circuit. The TX processor outputs the first packet from an output port of the OpenFlow switch in accordance with the action indicated by the OpenFlow controller. In response to the response OpenFlow message to the host, the host causes the TCAM lookup functionality to be updated so that the TCAM lookup functionality now has a TCAM entry for the flow, and so that the TCAM entry for the flow identifies the action indicated by the OpenFlow controller. This TCAM functionality updating occurs before a second packet of the flow is received.

The second packet of the flow is then received onto the NFP integrated circuit via the RX processor. As was done with the first packet, a hash is generated from the flow key of header information of the second packet. The load balancer processor uses the hash to direct a descriptor for the second packet to the same worker processor that handled the descriptor for the first packet. The worker processor causes a table lookup operation to be performed by the flow table lookup functionality. A matching flow entry is found in the flow table, but the action of the flow entry is the instruction to perform a TCAM lookup. The TCAM lookup operation is therefore performed by the TCAM lookup functionality, and a match is found. The matching TCAM entry identifies the action (the action that was determined by the OpenFlow controller in response to the first packet). Once the worker processor is aware of the actual action to be executed, the worker processor causes the flow table functionality to be updated such that the flow table entry for the flow now directly identifies the action (and does not just contain an instruction to perform a TCAM lookup). The worker processor applies the action to the second packet, and as a result the second packet is output via the TX processor from the same output port from which the first packet was output.

At this point, the flow table contains a flow entry for the flow, and the flow entry directly identifies the action. Each subsequent packet of the flow is thereafter processed by the same worker processor that in turn causes the flow table lookup functionality to perform a flow table lookup. The flow table lookup finds the flow entry for the flow, the action by the flow entry is determined, and the action is applied to the subsequent packet without any TCAM lookup operation having been attempted, and without any request OpenFlow message having been sent to the OpenFlow controller.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 2A and 2B together form a FIG. 2. FIG. 2 is a diagram that shows OpenFlow switch 3 of FIG. 1 in further detail.

FIGS. 5A and 5B together form a FIG. 5. FIG. 5 is a flowchart of a method 200 of operation of the system 1 of FIG. 1.

DETAILED DESCRIPTION

Reference will now be made in detail to some embodiments of the invention, examples of which are illustrated in the accompanying drawings.

Figure 1:
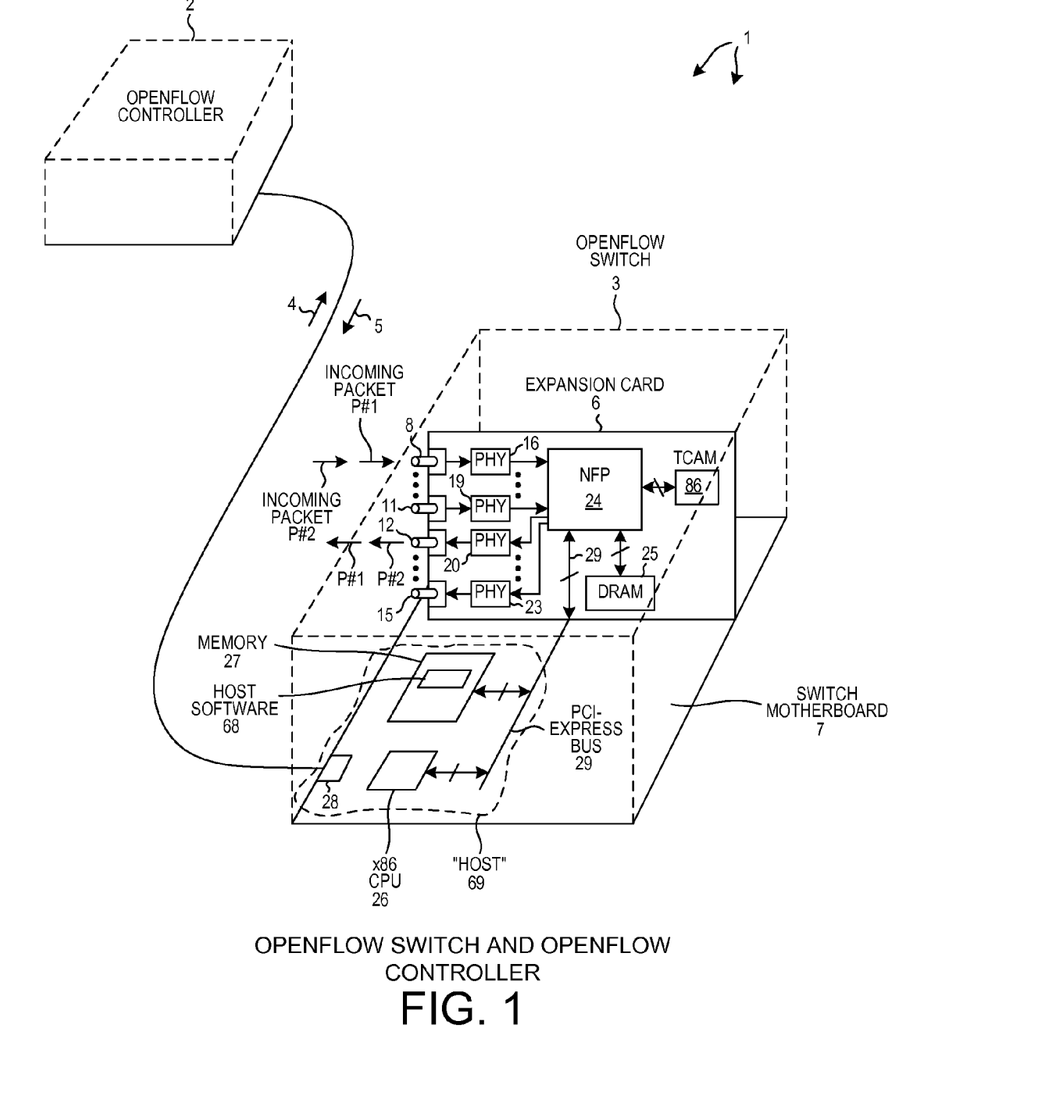
FIG. 1 is a diagram of a system 1 involving an OpenFlow controller 2 and an OpenFlow switch 3.

FIG. 1 is a diagram of a system 1 involving an OpenFlow controller 2 and an OpenFlow switch 3. The OpenFlow controller 2 and OpenFlow switch 3 communicate with one another in accordance with the OpenFlow protocol by sending each other OpenFlow messages, such as OpenFlow messages 4 and 5. OpenFlow switch 3 includes an expansion card 6 (a printed circuit board) and a motherboard 7. Disposed on expansion card 6 is a number of input ports 8-11, a number of output ports 12-15, a number of corresponding PHY circuits 16-23, a Network Flow Processor (NFP) integrated circuit 24, an amount of external DRAM 25, as well as other circuitry (not shown). Disposed on motherboard 7 is a Central Processing Unit (CPU) 26 such as an x86 architecture processor, an amount of external memory 27, a network port 28 usable for communication with the OpenFlow controller 2, as well as other circuitry (not shown). The NFP 24 and the CPU 26 communicate with one another across a PCI-express bus structure 29. In one example, there are many such switches that are intercoupled together to form a subnetwork of switches. In one example, the subnetwork is an MPLS subnetwork of OpenFlow switches. Each of the OpenFlow switches of this MPLS subnetwork has a dedicated communication path to the OpenFlow controller via its network port 28. Host software 68 that is executed by CPU 26 is stored in memory 27. The functionality of CPU 26 and host software 68 is also generally referred to as the "host" 69.

Figure 2A:
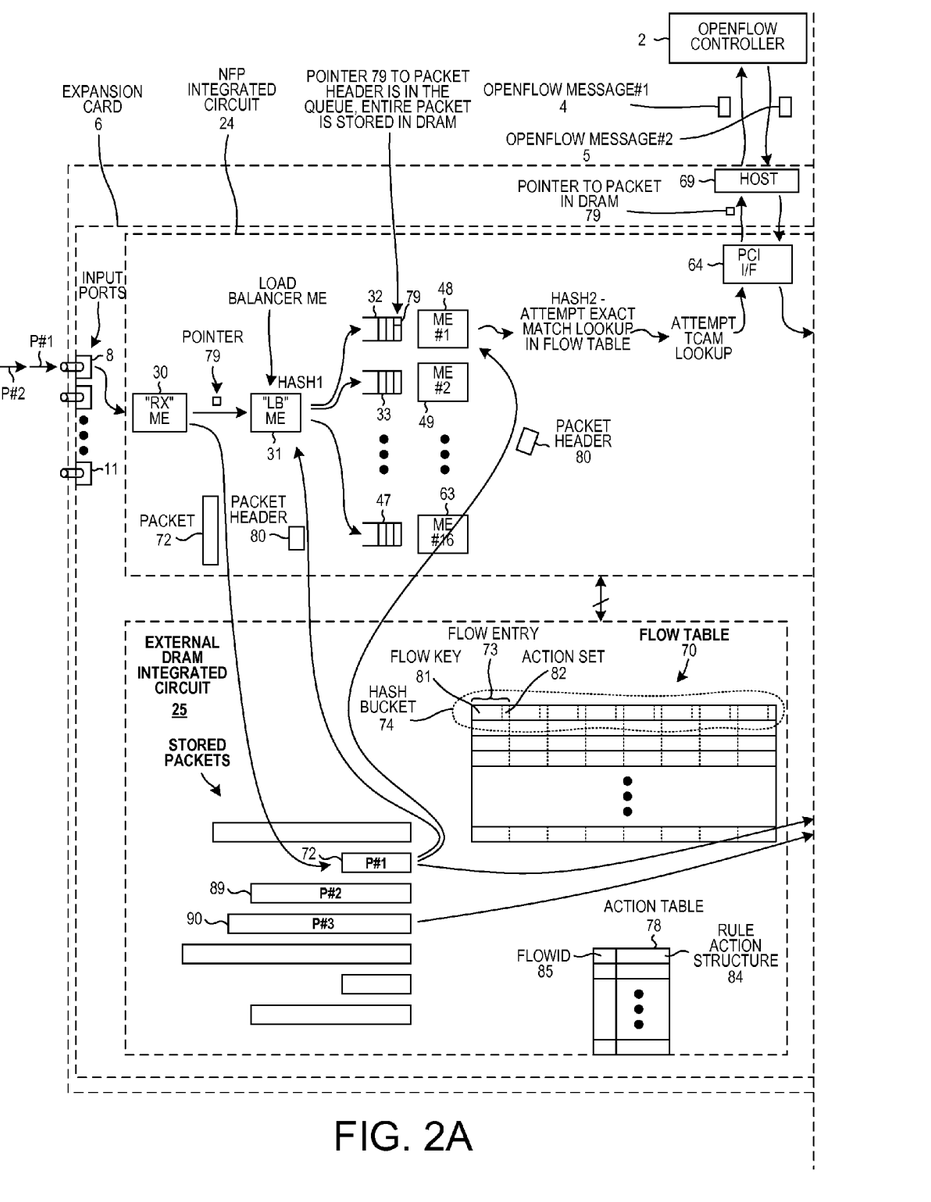
Figure 2B:
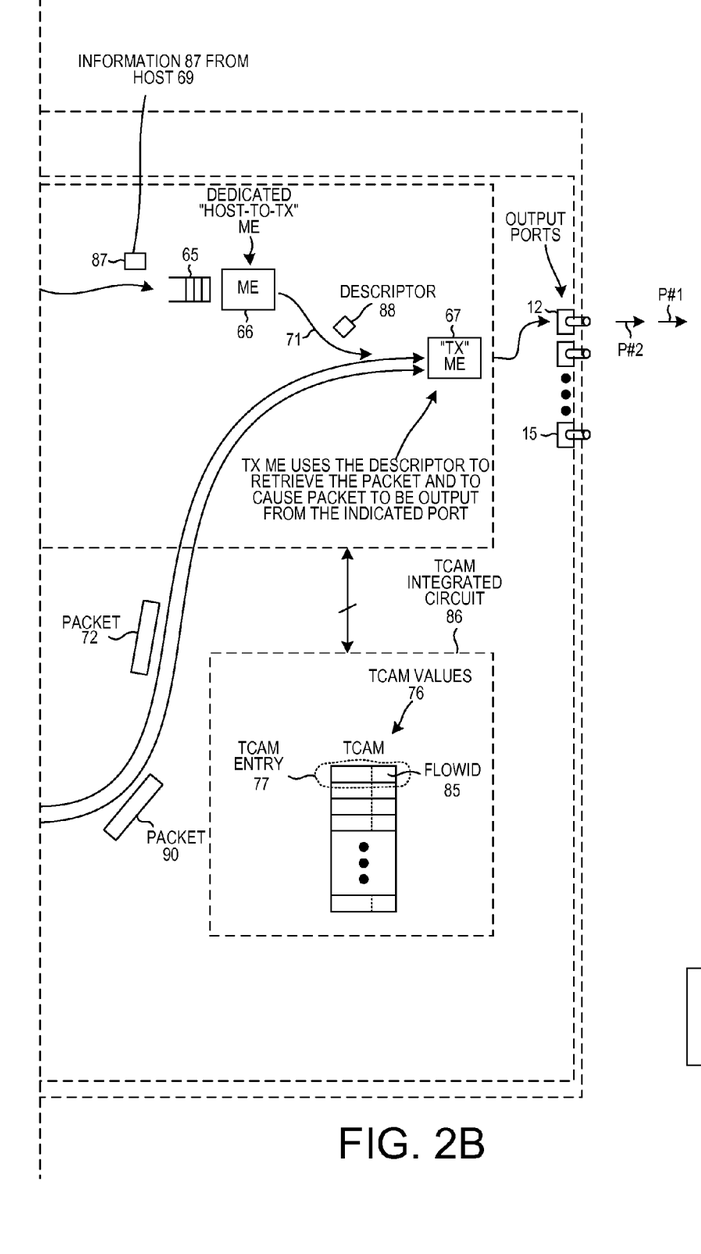

FIGS. 2A and 2B form a single figure, FIG. 2. FIG. 2 is a diagram that shows OpenFlow switch 3 in further detail. The NFP integrated circuit 24 includes a receiver microengine 30 (denoted "RX ME"), a load balancer microengine 31 (denoted "LB ME"), sixteen queues 32-47, sixteen worker microengines 48-63 (denoted ME#1-ME#16), a PCI bus interface circuit 64, an OpenFlow egress queue 65, a dedicated "Host-to-TX" microengine 66, a transmitter microengine 67 (denoted "TX" ME), as well as other circuits (not shown).

In one operational example, an incoming packet P#1 72 is received onto the switch and onto expansion card 6. This packet P#1 is the first packet of a flow. Packet P#1 may be an IP packet prepended by one or more MPLS labels. In the present example, there is no flow entry in flow table 70 for the flow. Packet P#1 is received via input port 8 and is passed to receiver ME30. RX ME 30 stores the packet P#1 72 into external DRAM 25 and passes a descriptor 79 to load balancer LB ME 31. The descriptor 79 includes the DRAM address where the packet is stored, the packet length in bytes, and the input port number.

LB ME 31 uses address information in the descriptor 79 to retrieve the packet header 80 from DRAM 25. From the packet header 80, the LB ME 31 extracts a set of fields. From these fields of the header, the LB ME31 uses a first hash function to generate a first hash. The first hash is used by the LB ME 31 to send descriptor 79 to one of the sixteen queues 32-47. The descriptor 79 indicates where the packet P#1 has been stored in external DRAM 25. In the present example, 104 bits of header information are used to generate the first hash. This 104 bits is the so-called OpenFlow five-tuple, consisting of: Source and Destination IPv4 headers, Source and Destination Ports and IPv4 protocol.

Each such first hash value identifies a unique and different one of the queues such that all packets for a given flow will be directed by the load balancing LB ME 31 to the same queue. Packets of a given flow will therefore be in order within a queue. In the example being described, the descriptor for packet P#1 is present in queue 32. From queue 32 the descriptor to packet P#1 is passed to ME#1 48.

ME#1 48 uses the descriptor 79 to retrieve the packet header 80 from DRAM. From the packet header 80, the ME#1 extracts another set of header fields. This other set of header fields is referred to as the flow key 81. In the present example, the flow key 81 is the so-called 11-tuple. The 11-tuple is 256 bits. From the 256-bit flow key, ME#1 48 uses a second hash function to generate a second hash. The second hash is used to perform a look-up operation for first packet P#1 72.

Figure 3:
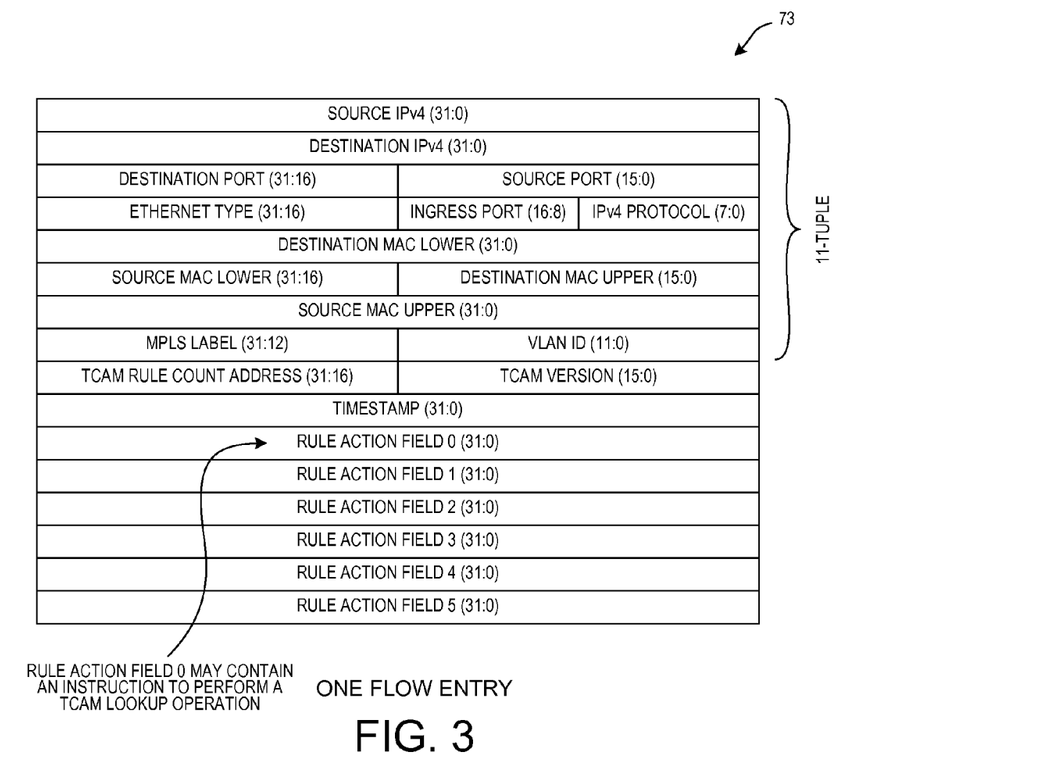
FIG. 3 is a diagram of flow entry 73.

In this example, each hash bucket of flow table 70 has eight flow entry fields. Each flow entry field may contain a flow entry or may be empty. Reference numeral 74 identifies one hash bucket. Hash bucket 74 has eight flow entry fields. The first flow entry field is occupied with a flow entry 73. The flow entry 73 includes the flow key 81 and a corresponding action set 82. (Although what is stored in the flow entry is actually an indication of an action or a set of actions, the flow entry is described in a general and less precise manner as simply storing the action or action set.)

In the operation example being explained, a lower set of the hash bits of the second hash is used as an index to a hash bucket in DRAM. An upper set of the hash bits of the second hash are used to identify a flow entry from the indexed hash bucket. If a match is found, the combination of the complete second hash is used to generate an index to the hash bucket in the flow table 70. For each matching flow entry in the hash bucket, the stored flow key of the flow entry is compared with the full 256-bit flow key 81 of the incoming packet. All the matching flow entries are checked in this way to find the flow entry for P#1 in flow table 70.

In the present example, there is no flow entry in the hash bucket 74 that matches the 256-bit flow key 81 of packet P#1. In response, ME#1 48 causes a flow entry for the new flow to be written into the identified hash bucket in flow table 70, where this new flow entry includes the 256-bit flow key 81 for packet P#1.

Figure 4:
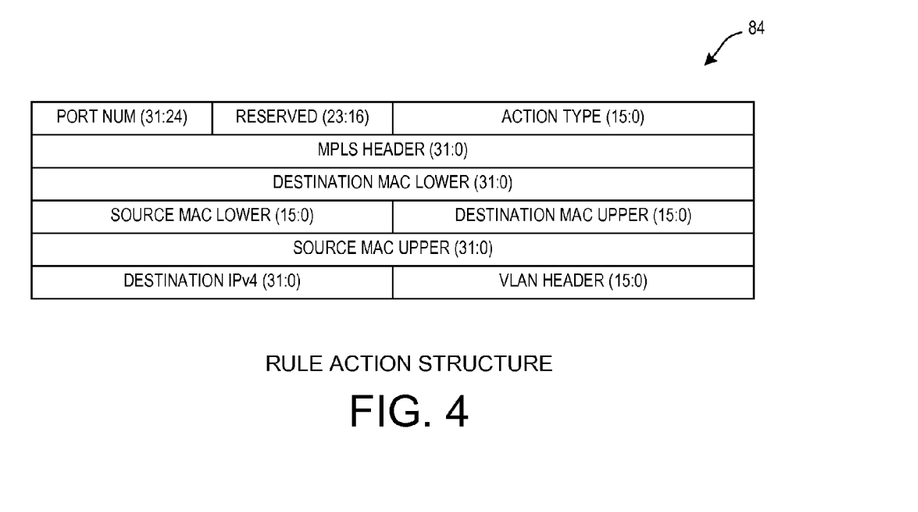
FIG. 4 is a diagram of rule action structure 84.

Because no flow entry was found in flow table 70 for the flow of the incoming first packet P#1, the ME#1 next causes a TCAM lookup operation to be performed. The TCAM lookup operation may actually be a TCAM emulation operation performed in software using a table of TCAM values stored in external DRAM 25. The TCAM table of TCAM values 76 is set up to enable wildcard matching of various bits in the 256-bit header to identify a matching action. Each TCAM entry includes a TCAM match value, that may include wildcard bits, as well as a corresponding index (flow ID) used to address a rule action structure stored in an action table 78. Reference numeral 84 identifies one rule action structure that is identified by index 85. The rule action structure specifies an action, or an action set.

In the present example, the TCAM lookup operation is performed by a separate TCAM integrated circuit 86. The TCAM integrated circuit 86 is coupled to the NFP integrated circuit 24 by a parallel bus. The TCAM table is stored in the TCAM integrated circuit. TCAM entry 77 is an example of one such TCAM entry. The index (flow ID) 85 points to corresponding rule action structure 84 (that specifies an action set) stored in action table 78.

In the present example, the TCAM lookup operation also does not return a match because first packet P#1 72 is the first packet of the new flow. As a result of the TCAM lookup operation not resulting in a match, the ME#1 48 causes a flow entry (flow entry 73) for the flow of first packet P#1 72 to be added to flow table 70. The action portion of this new flow entry 73, however, contains an instruction to perform a TCAM lookup operation. This instruction to perform a TCAM lookup operation is an instruction to pass the 11-tuple header (flow key 81) to the TCAM for the lookup operation. In addition, the ME#1 48 causes a request OpenFlow message 4 to be sent to the OpenFlow controller 2 via PCI interface circuit 64. The PCI interface circuit 64 actually in this case communicates with the host 69 across PCI bus 29. This communication includes the descriptor 79 that indicates where the packet stored in DRAM. The host 69 in turn generates and sends the OpenFlow message 4 to the OpenFlow controller 2 via port 28. OpenFlow message 4 is a request that the OpenFlow controller tell the switch 3 what to do with packet P#1. OpenFlow message 4 includes a descriptor of the packet P#1. The descriptor includes the 256-bit flow key 81 of packet P#1 as well as the descriptor 79 indicating where in DRAM 25 the first packet P#1 is stored.

OpenFlow controller 2 responds by returning a second response OpenFlow message 5 to the switch 3. OpenFlow message 5 is received via port 28 and host 69. This OpenFlow message 5 contains an action set to be performed on packet P#1 and all subsequent packets of that flow. In the present example, the action set includes an instruction to output the packet P#1 from a particular output port. Host 69 receives the OpenFlow message 5 and applies the action set to packet P#1 in DRAM. As part of applying the action set, the host 69 writes information 87 into the OpenFlow egress queue 65 via PCI interface circuit 64. This information 87 includes: 1) the DRAM address where the packet P#1 is stored, 2) the packet length in bytes, and 3) the output port out of which packet P#1 is to be output. OpenFlow egress queue 65 is exclusively for communication between the PCI interface circuit 64 and the TX ME 67. In addition, host 69 programs and interacts with the TCAM lookup functionality, via PCI interface 64, so that the TCAM lookup functionality contains a TCAM entry, where the TCAM entry includes the 256-bit flow key 81 of the packet and an index (flow ID). It is the host 69, and not the worker ME#1 that initiates and controls the TCAM updating. The index (flow ID) of the new TCAM entry identifies a rule action structure in action table 78, where the rule action structure identified indicates the action (or action set) that was specified by the OpenFlow controller for the flow. Host 69 interacts with NFP 24, and causes the TCAM functionality to be programmed in this way, via PCI interface 64.

Dedicated "Host-to-TX" microengine 66 receives the information 87 from queue 65 and then processes and translates the information 87 into a corresponding descriptor 88 in the appropriate form for TX ME 67, so that TX ME 67 will inject the packet P#1 into the main data flow of packets being handled by the switch. Host-to-TX ME 66 causes this injecting to occur by passing the descriptor 88 for packet P#1 to TX ME 67. Descriptor 88 includes: 1) the payload pointer to where packet P#1 is stored in DRAM, 2) the packet length, 3) the L2 header information, and 4) the output port that packet P#1 should be output from. The passing of descriptor 88 to the TX ME 67 is indicated by arrow 71 in FIG. 2. When TX ME 67 receives the descriptor 88, the TX ME 67 uses information in the descriptor 88 to pull the packet P#1 from DRAM. In the case of first packet P#1 in this example, the TX ME 67 then supplies packet P#1 to the output port 12 indicated by descriptor 88. TX ME 67 does not initiate any flow table lookup operations, nor does TX ME 67 initiate any TCAM lookup operations.

Host-to-TX ME 66 has additional capability for specific packet processing requirements. For example, to support port switching internal to the NFP, of which host 69 is unaware. The path from the OpenFlow controller 2, through the dedicated "Host-to-TX" ME 66, to TX ME 67, and out of the NFP integrated circuit 24 is a dedicated fast-path for non-matching first packets of flows.

At this point, there is a flow entry in flow table 70 for the flow of packets of packet P#1, but the action set portion of that flow entry is an instruction to perform a TCAM lookup. The action set portion of the flow entry does not indicate any other action or action set. The TCAM integrated circuit 86 has been loaded so that a TCAM entry for the flow is present, and so that the flow ID of this TCAM entry points to the rule action structure in the action table 78 that in turn indicates the action specified by the OpenFlow controller.

Next, the second packet P#2 89 for the flow is received onto switch 2. Packet P#2 passes through the same path that packet P#1 passed. LB ME 31 uses the first hash function to generate the same first hash value, so packet P#2 89 is directed to the same worker ME#1 to which the first packet P#1 was directed. For this second packet P#2, the worker ME#1 48 performs a flow table lookup operation in the flow table 70. A match is found because a flow entry for the flow was previously added to the flow table as a result of packet P#1 being handled. When the worker microengine ME#1 48 requests the flow table lookup from the flow table functionality, however, the flow table lookup process returns the action set part of the flow entry, but this action set part is just an instruction to perform a TCAM lookup. A TCAM lookup is therefore automatically attempted. The TCAM query is successful because the TCAM 86 was loaded with a matching TCAM entry by the host 69 as a consequence of the host 69 receiving the OpenFlow message for the first packet P#1. The TCAM lookup query returns the flow ID of the TCAM entry, which in turn identifies the rule action structure in action table 78 for the flow, which in turn indicates the action (or action set) to be performed. ME#1 48 obtains the action (or action set) in this way, and then causes the action (or action set) to be added to the flow entry for the flow in flow table 70. Accordingly, a future query of the flow table lookup process for this flow will return the actual action (or action set) without consulting the action table, and will not just return an instruction to perform a TCAM lookup.

In the process flow of the second packet P#2 89, ME#1 48 executes the action (or action set) on the second packet 89 stored in DRAM. In this case, ME#1 does not read the second packet 89 out of DRAM. ME#1 forwards a descriptor for the packet P#2 directly to the TX ME 67 for egress processing (thereby bypassing the OpenFlow controller 2). TX ME 67 uses the descriptor to retrieve the second packet P#2 89 from DRAM 25. In the present example, the action is to output the second packet P#2 from the switch via the same output port from which packet P#1 was output.

At this point, the flow table 70 has been loaded to have a flow entry for the flow, where the action set portion of the flow entry identifies the action (or action set) specified by the OpenFlow controller in OpenFlow message 5. The indication of the real action to be executed has now replaced the initial instruction to perform a TCAM lookup. Accordingly, each subsequent packet 90 of the flow that is received onto the switch is stored into DRAM and is processed by the same worker microengine ME#1. The ME#1 causes a flow table lookup operation to be performed, which results in the flow entry being found in the flow table. The action portion of the flow entry indicates the action (or action set) to be applied to the packet 90. Once the ME#1 learns of the action (or action set), the ME#1 executes the action (or action set) on the packet stored in DRAM and sends a descriptor directly from the worker ME#1 to the TX ME 67, where the descriptor includes address information (a pointer) to where the packet 90 is stored in DRAM and where the descriptor indicates how the packet is to be output from the switch. The TX ME 67 uses the address information from the descriptor to retrieve the packet 90 from DRAM 25 and then outputs the packet 90 from the switch in accordance with the indicated action as specified by the descriptor.

TCAM lookup operations can be a bottleneck in packet/flow classification systems. In a first novel aspect, the method described above allows the use of TCAM lookups in such systems to be limited so that the requirement for TCAM queries/accesses can be similarly minimized. For the match-action functionality required by the OpenFlow standard, the method uses a flow table lookup process in addition to a TCAM lookup process. Only the first two packets of a flow cause TCAM lookups to occur in order to determine the action (or action set) to execute on those packets. The actions for subsequent packets are determined using only flow table lookups. Application of the method results in accelerated switch throughput without use of a large hardware TCAM.

In a second novel aspect, a dedicated host-to-TX microengine is provided so that a fast-path from an OpenFlow controller to the outputting TX functionality of the OpenFlow switch exists for packets, the actions for which have been determined by the OpenFlow controller. An advantage of the fast-path is that packets can be modified by the host and sent directly to the transmitting functionality of the switch. Without this, such a modified packet would otherwise need to be passed from the host to the beginning of the worker datapath and processed from there (i.e., check the flow table, check the TCAM, apply actions, and pass the packet to the transmitting functionality). Furthermore, to avoid the inserted packet being output from the switch out of order in the flow, additional statistical information would need to be gathered to enable an insertion of the packet in the correct position in a queue of outgoing packets of the flow. In contrast, the host-to-TX microengine enables packets to be sent from the host directly to the end of the packet processing pipeline of the switch.

FIG. 3 is a diagram of flow entry 73.

FIG. 4 is a diagram of rule action structure 84.

Figure 5A:
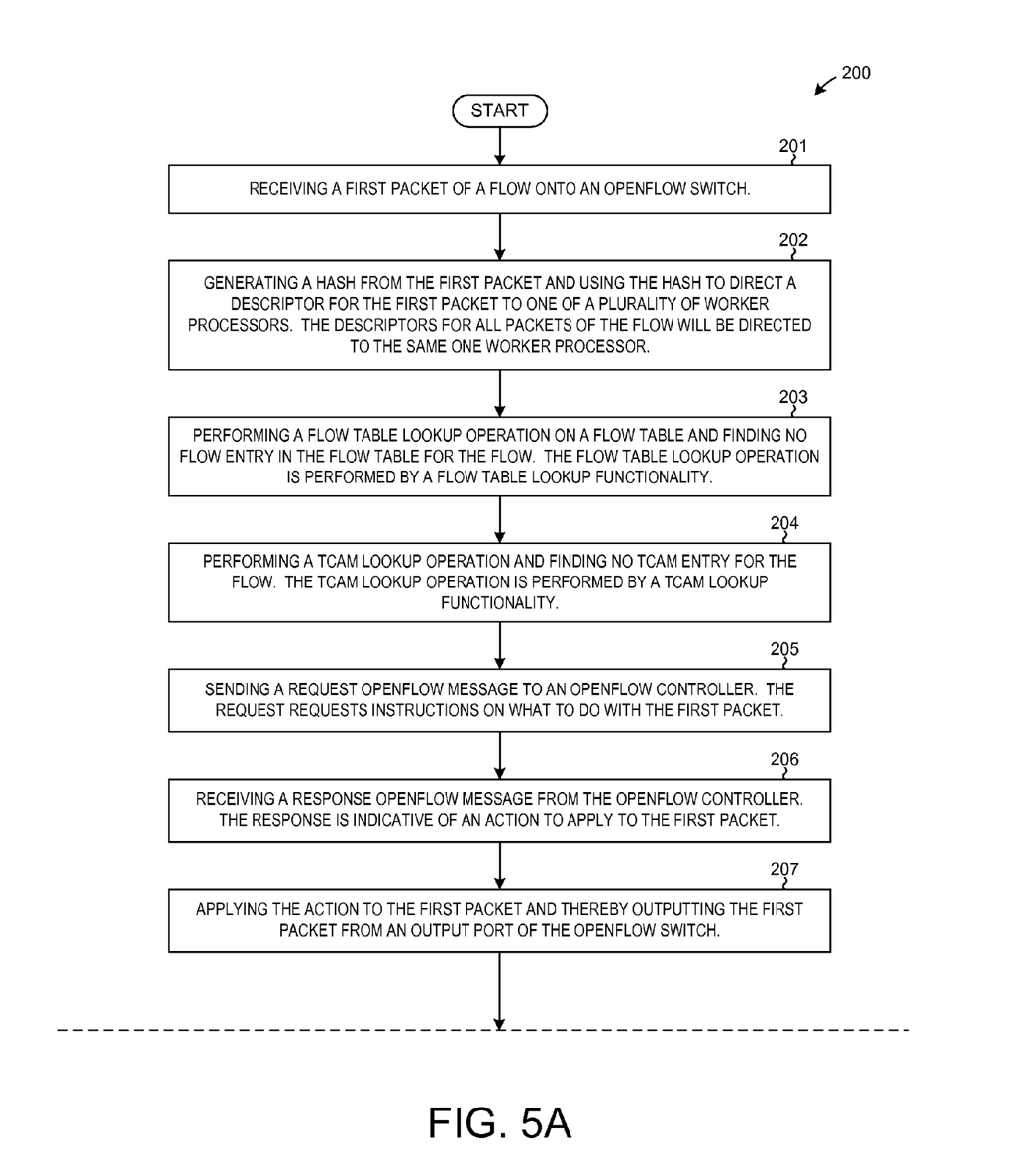
Figure 5B:
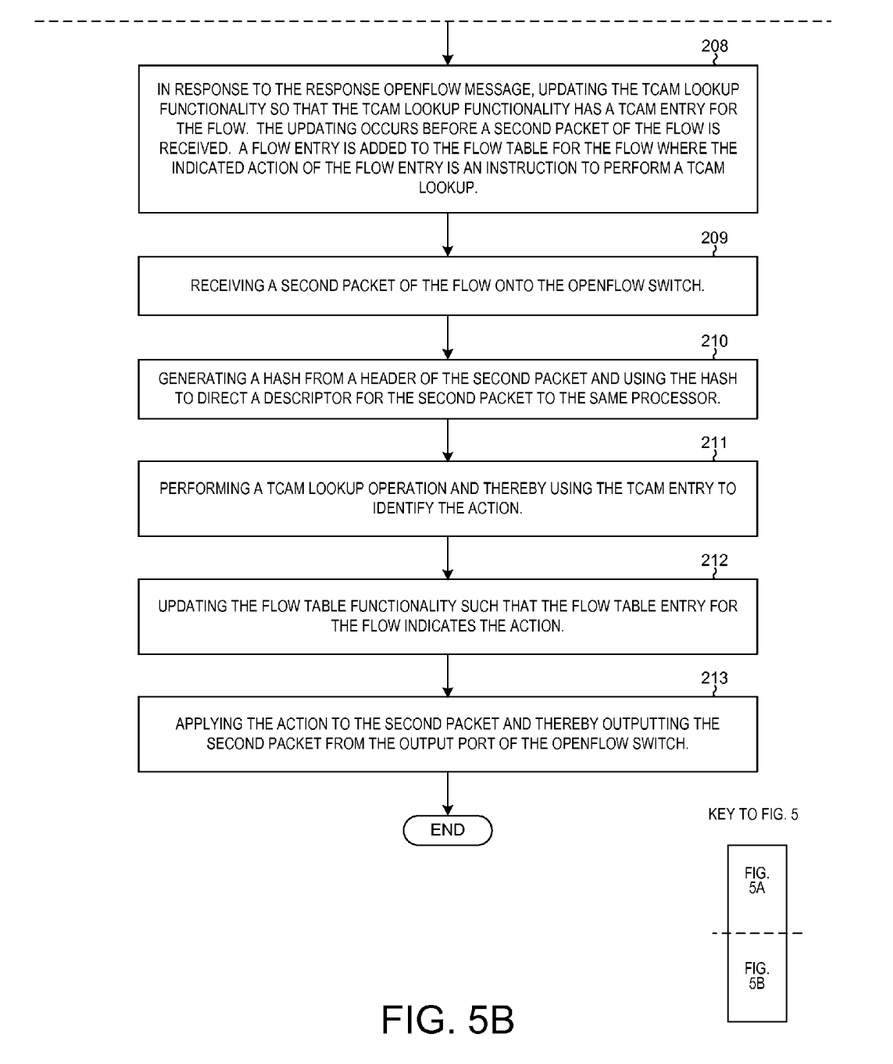

FIGS. 5A and 5B together form a figure, FIG. 5. FIG. 5 is a flowchart of a method 200 of operation of the system 1 of FIG. 1. A first packet of a new flow is received (step 201) onto an OpenFlow switch. A hash is generated from the first packet and the hash is used to direct at least a descriptor for the first packet to one of the worker processors (step 202). A flow table lookup is then performed (step 203) using a flow table lookup functionality, but no matching flow entry is found. Because no matching flow entry is found, a TCAM lookup operation is performed (step 204) using a TCAM lookup functionality, but no match is returned from the TCAM lookup functionality. As a result of there being no match found in the flow table nor in the TCAM, a request OpenFlow message is sent (step 205) from the OpenFlow switch to an OpenFlow controller requesting instructions on what to do with the first packet. A response OpenFlow message is received (step 206) back from the OpenFlow controller. The response OpenFlow message is indicative of an action to apply to the first packet. The OpenFlow switch applies (step 207) the action to the first packet and thereby outputs the first packet from an output port of the OpenFlow switch. In response to the response OpenFlow message, the TCAM lookup functionality is updated (step 208) so that the TCAM lookup functionality has a TCAM entry for the flow. The updating occurs before a second packet of the flow is received. A flow entry for the flow is added to the flow table, but the action portion of the flow entry is an instruction to perform a TCAM lookup operation. The second packet of the flow is then received (step 209). As was done with the first packet, a hash is generated from the second packet (step 210) and the hash is used to direct a descriptor for the second packet to the same worker processor that handled the descriptor for the first packet. A flow table lookup operation is performed, but the returned action is the instruction to perform a TCAM lookup. Accordingly, the TCAM lookup operation is performed (step 211) and a match is found. The matching TCAM entry identifies the action (the action that was determined by the OpenFlow controller in response to the first packet). The flow table functionality is then updated (step 212) such that the flow table entry for the flow directly identifies the action (and does not just contain an instruction to perform a TCAM lookup operation). The action is applied (step 213) to the second packet, and as a result the second packet is output from the same output port from which the first packet was output. At this point the flow table contains a flow entry for the flow, and this flow entry identifies the action. Subsequent packets of the flow are processed by the same worker processor that in turn causes a flow table lookup to be performed. The flow table lookup results in a match, the indicated action (the action portion of the matching flow entry) is determined, and the indicated action is applied to the subsequent packet, without any TCAM lookup operation having been attempted, and without any request OpenFlow message having been sent to the OpenFlow controller.

Although the present invention has been described in connection with certain specific embodiments for instructional purposes, the present invention is not limited thereto. The flow table of the flow table lookup functionality need not contain actions itself, but rather actions may be stored in an action table and a flow entry in the flow table can contain a pointer to the appropriate action in the action table. The flow table and the action table are both parts of the flow table lookup functionality, even though the action table is shared with the TCAM lookup functionality. Although one transmission processor is described above and the fast-path is said to pass through this one transmission processor, the load many actually be shared among multiple transmission processors in which case the multiple transmission processors are considered together to be one transmission processing functionality or processor. Accordingly, various modifications, adaptations, and combinations of various features of the described embodiments can be practiced without departing from the scope of the invention as set forth in the claims.

What is claimed is:

1. A method comprising:
    (a) receiving a first packet of a flow onto an OpenFlow switch;
    (b) generating a hash from a header of the first packet, and using the hash to direct a descriptor for the first packet to one of a plurality of processors such that the descriptors for all packets of the flow are directed to the same one processor;
    (c) performing a flow table lookup operation on a flow table and finding no flow entry in the flow table for the flow, wherein the flow table lookup operation is performed by a flow table lookup functionality;
    (d) performing a TCAM (Ternary Content Addressable Memory) lookup operation and finding no TCAM entry for the flow, wherein the TCAM lookup operation is performed by a TCAM lookup functionality;
    (e) sending a request OpenFlow message to an OpenFlow controller;
    (f) receiving a response OpenFlow message from the OpenFlow controller, wherein the response OpenFlow message is indicative of an action;
    (g) applying the action to the first packet and thereby outputting the first packet from an output port of the OpenFlow switch;
    (h) in response to the response OpenFlow message updating the TCAM lookup functionality so that the TCAM lookup functionality has a TCAM entry for the flow, wherein the updating of (h) occurs before a second packet of the flow is received;
    (i) receiving the second packet of the flow onto the OpenFlow switch;
    (j) generating a hash from a header of the second packet and using the hash to direct a descriptor for the second packet to the same one processor to which the descriptor in (b) was directed;
    (k) performing a TCAM lookup operation and thereby using the TCAM entry to identify the action;
    (l) updating the flow table functionality such that a flow table entry for the flow indicates the action, and wherein (l) occurs after the second packet is received in (i); and
    (m) applying the action to the second packet and thereby outputting the second packet from the output port of the OpenFlow switch, wherein (a) through (m) are performed by the OpenFlow switch.

2. The method of claim 1, wherein a flow entry that matches the flow is added to the flow table after the first packet is received in (a) and before the second packet is received in (i), and wherein the flow entry at the time the second packet is received in (i) stores an instruction to perform a TCAM lookup operation.

3. The method of claim 1, wherein the response OpenFlow message received in (f) results in the first packet being output from the OpenFlow switch without said one processor having determined the action for the first packet.

4. The method of claim 1, wherein the OpenFlow switch has a primary data path through which non-exception packets pass from the plurality of processors, through a transmission processor, and to one of a plurality of output ports of the OpenFlow switch, wherein the OpenFlow switch also has an interface through which the OpenFlow switch communicates OpenFlow messages, and wherein the OpenFlow switch has a fast-path path from the interface to the transmission processor.

5. The method of claim 4, wherein the fast-path path passes through a queue, and wherein the queue is exclusively for communications between the interface and the transmission processor.

6. The method of claim 5, wherein the OpenFlow switch includes a host processor disposed on a first printed circuit board and a network flow processor disposed on a second printed circuit board, wherein the host processor causes the updating of (h) to occur by interacting across the interface with the TCAM functionality, and wherein said one processor of (b) does not initiate or control the updating of (h).

7. The method of claim 5, wherein the fast-path path includes a dedicated fast-path processor, wherein the dedicated fast-path processor receives information from the interface, wherein the information received is information from the response OpenFlow message of (h), and wherein the dedicated fast-path processor translates the information into a descriptor and then supplies the descriptor to the transmission processor.

8. The method of claim 1, wherein the hash of (b) is generated using a hash function, wherein a hash is generated for each incoming packet and the hash is then used to direct a descriptor for the packet to one of the plurality of processors, wherein the descriptors for all packets of a flow are directed to the same processor, and wherein the hash function causes descriptors to be spread across the plurality of processors such that each processor receives descriptors for packets of one or more flows.

9. The method of claim 4, wherein the transmission processor does not initiate any flow table lookup operation nor does the transmission processor initiate any TCAM lookup operation, and wherein the transmission processor retrieves packets from a memory and then supplies the retrieved packets to the plurality of output ports.

10. A method comprising:
    (a) receiving a first packet of a flow onto an OpenFlow switch, wherein the OpenFlow switch includes a memory, a worker processor, flow table functionality, a TCAM(Ternary Content Addressable Memory) functionality, and a transmission processor, wherein the flow table functionality includes a flow table;
    (b) storing the first packet into the memory, wherein the first packet has a header;
    (c) the worker processor retrieving the header of the first packet from the memory, generating a hash from the header, and using the hash to initiate a flow table lookup using the flow table functionality;
    (d) the flow table functionality performing a flow table lookup operation but not returning a match for a flow key of the flow;
    (e) the worker processor initiating a TCAM lookup operation using the TCAM lookup functionality;
    (f) the TCAM lookup functionality performing a TCAM lookup operation but not returning a match for the flow key of the flow;
    (g) in response to neither of the flow table lookup operation nor the TCAM lookup operation returning a match the worker processor causing a flow entry for the flow to be added into the flow table, wherein the flow entry includes an instruction to perform a TCAM lookup;
    (h) sending a message to an OpenFlow controller;
    (i) receiving a response message back from the OpenFlow controller, wherein the response message is indicative of an action to be performed on the first packet;
    (j) updating the TCAM functionality with the action so that the flow key for the flow is associated in the TCAM functionality with the action, wherein the worker processor is not involved in the updating of the TCAM functionality;

(k) the transmission processor retrieving the first packet from the memory and outputting the first packet from the OpenFlow switch in accordance with the action, wherein the worker processor is not involved in the retrieving of the first packet nor is the worker processor involving in outputting the first packet from the OpenFlow switch, wherein (a) through (k) occur before a second packet of the flow is received onto the OpenFlow switch;

(l) receiving the second packet of the flow onto the OpenFlow switch;

(m) storing the second packet into the memory, wherein the second packet has a header;

(n) the worker processor retrieving the header of the second packet from the memory, generating a hash from the header, and using the hash to initiate a flow table lookup using the flow table functionality;

(o) the flow table lookup functionality performing a flow table lookup operation and returning a match for the flow key of the flow, wherein the flow table functionality returns the instruction to perform a TCAM lookup;

(p) the worker processor initiating a TCAM lookup operation using the TCAM lookup functionality;

(q) the TCAM lookup functionality performing a TCAM lookup operation and returning a match for the flow key of the flow, wherein the TCAM functionality returns the action;

(r) the worker processor initiating an updating of the flow entry in the flow table so that the flow entry no longer includes the instruction to perform a TCAM lookup operation but rather so that it now includes the action; and (s) the transmitter processor retrieving the second packet from the memory and outputting the second packet from the OpenFlow switch in accordance with the action, wherein the transmission processor initiates no flow table lookup operations and initiates no TCAM lookup operations, wherein (a) through (s) are performed by the OpenFlow switch.

11. The method of claim 10, wherein the flow table is stored in the memory.

12. The method of claim 10, wherein the memory is a semiconductor memory integrated circuit, and wherein the worker processor and the transmission processor are parts of a network flow processor integrated circuit.

13. The method of claim 12, wherein the OpenFlow switch further comprises a host processor, wherein the message is sent in (h) out of the host processor, and wherein the response message received in (i) onto the host processor.

14. An OpenFlow device comprising:
a flow table lookup functionality;
a TCAM (Ternary Content Addressable Memory) lookup functionality; and means: 1) for receiving a first packet of a flow and in response thereto adding a flow entry for the flow into a flow table, wherein the flow entry includes an instruction to perform a TCAM lookup operation, 2) for sending a message to an OpenFlow controller, 3) for receiving a response message from the OpenFlow controller and in response thereto updating the TCAM lookup functionality with an action indicated by the response message, 4) for receiving a second packet of the flow and in response thereto performing a lookup table operation and returning the instruction to perform a TCAM lookup operation, 5) for performing a TCAM lookup operation in response to the returning of the instruction to perform a TCAM lookup operation, and returning the indication of the action, and 6) for causing the indication of the action to be stored in the flow entry.

15. The OpenFlow device of claim 14, wherein the means includes a plurality of input ports, a plurality of output ports, a host processor and a part of a network flow processor integrated circuit.

16. The OpenFlow device of claim 15, wherein the flow table is stored in a memory integrated circuit, wherein the network flow processor integrated circuit and the memory integrated circuit are two different integrated circuits.

17. The OpenFlow device of claim 14, wherein a first TCAM lookup operation is performed in response to the first packet being received by the means, and wherein a second TCAM lookup operation is performed in response to the second packet being received by the means.

18. The OpenFlow device of claim 14, wherein the means includes a worker processor and a transmission processor, wherein the worker processor generates hashes for use in flow table lookup operations, wherein the transmission processor outputs the first and second packets from the means but does not initiate any flow table lookup operations nor any TCAM lookup operations, and wherein the worker processor is not involved in the updating of the TCAM lookup functionality in response to the response message from the OpenFlow controller.

19. The OpenFlow device of claim 14, wherein the means has a primary data path through which non-exception packets pass from worker processors, through the means to a transmission processor, wherein the means also has an interface through which the means communicates with an OpenFlow controller, and wherein the means also has a fast-path path from the interface and to the transmission processor, wherein the fast-path path does not pass through any of the worker processors.

20. The OpenFlow device of claim 14, wherein a host processor uses the fast-path path to inject packets into the end of the primary data path so that the injected packets are output from the means by the transmission processor, wherein the injected packets do not pass through any of the worker processors.

* * * * *